United States Patent [19]

Kohler

[11] Patent Number: 4,730,264
[45] Date of Patent: Mar. 8, 1988

[54] ARRANGEMENT FOR DETECTING MEASURING DATA IN MOTOR VEHICLES

[75] Inventor: Rolf Kohler, Schwieberdingen, Fed. Rep. of Germany

[73] Assignee: Robert Bosch GmbH, Stuttgart, Fed. Rep. of Germany

[21] Appl. No.: 762,109

[22] Filed: Aug. 2, 1985

[30] Foreign Application Priority Data

Aug. 4, 1984 [DE] Fed. Rep. of Germany ....... 3428879

[51] Int. Cl.⁴ .............................................. G01D 3/02
[52] U.S. Cl. ............................... 364/571; 364/431.07; 123/361; 123/494
[58] Field of Search ............... 123/361, 399, 352, 480, 123/494, 488; 364/571, 550, 431.07

[56] References Cited

U.S. PATENT DOCUMENTS

| | | | |
|---|---|---|---|
| 2,859,738 | 11/1958 | Campbell | 123/492 |
| 2,911,966 | 11/1959 | Fukkle | 123/492 |
| 4,391,250 | 7/1983 | Matsui | 123/494 |
| 4,470,396 | 9/1984 | Hasumi et al. | 123/488 |
| 4,490,804 | 12/1984 | Martinsons | 364/571 |
| 4,515,009 | 5/1985 | Hasegawa et al. | 123/478 |
| 4,519,361 | 5/1985 | Murakami | 123/361 |
| 4,520,783 | 6/1985 | Matsushita et al. | 123/494 |
| 4,592,322 | 6/1986 | Murakami et al. | 123/361 |
| 4,599,695 | 7/1986 | Deutsch | 364/431.07 |
| 4,612,615 | 9/1986 | Murakami | 123/361 |
| 4,615,409 | 10/1986 | Küpper et al. | 123/352 |

FOREIGN PATENT DOCUMENTS 3535642 7/1986 Fed. Rep. of Germany ...... 364/571

*Primary Examiner*—Parshotam S. Lall
*Attorney, Agent, or Firm*—Walter Ottesen

[57] ABSTRACT

An arrangement for detecting data in motor vehicles is disclosed especially in combination with the open or closed loop control of internal combustion engines. The arrangement includes at least one potentiometer as a data detector which permits, in at least one boundary region of the potentiometer band, the boundary values to be made to follow the measured value. Thus, a self-adjusting measuring arrangement is obtained which largely eliminates the need for manual fine adjustment. A flowchart discloses a computer-controlled realization of the invention.

6 Claims, 3 Drawing Figures

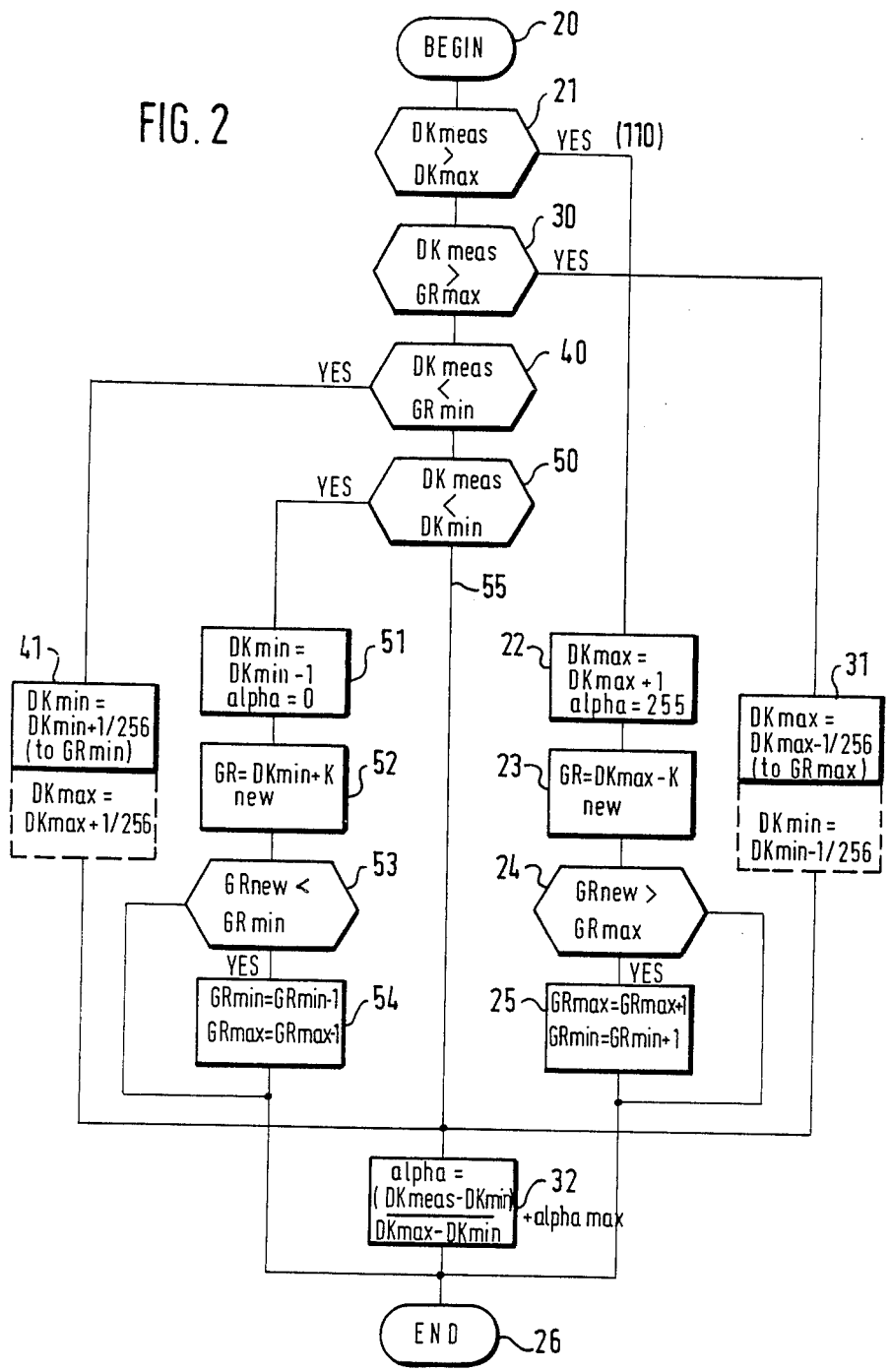

ARRANGEMENT FOR DETECTING MEASURING DATA IN MOTOR VEHICLES

FIELD OF THE INVENTION

The invention relates to an arrangement for detecting measuring data in motor vehicles such as in combination with the control of the internal combustion engine.

BACKGROUND OF THE INVENTION

For the open or closed loop control of internal combustion engines in motor vehicles, many quantities are available which can be detected by means of a potentiometer. These quantities are particularly the respective positions of the following: throttle flap, air flow measuring flap, accelerator pedal, or, for example, the control rack in a diesel fuel-injection pump. Some of these application examples for potentiometer data pick-ups require a highly accurate adjustment. However, in the mass-produced motor vehicle, this is not always without problems because especially drifts resulting from the aging of components as well as inaccuracies introduced by repair work must also be considered.

If the accuracy requirements regarding the adjustment of potentiometers are high, it is conventional practice to adjust the potentiometer sliders by means of fine adjusting screws. While this method permits a momentary calibration to be accomplished, its long-term accuracy is insufficient because of a number of circumstances.

SUMMARY OF THE INVENTION

In view of the above, it is an object of the invention to provide an arrangement for detecting data which affords ease of handling and long-term accuracy.

The arrangement of the invention for detecting measuring data optimally achieves the above object. Thus, the installation of a potentiometer as a data detecting device, whether in the factory or as a retrofit, is not subject to special accuracy requirements so that it can also be accomplished by unskilled labor. Moreover, a good long-term stability is ensured by the continuous automatic adjustment Further embodiments and advantages of the invention will become apparent from the subsequent description in conjunction with the drawing and from the claims.

BRIEF DESCRIPTION OF THE DRAWING

The invention will now be described in more detail with reference to the drawing wherein.

DESCRIPTION OF THE PREFERRED EMBODIMENT OF THE INVENTION

The embodiment disclosed herein relates to an arrangement for detecting measuring data in a motor vehicle used in combination with a fuel injection apparatus in which a fuel metering signal is generated in dependence on the throttle flap position and the rotational speed of the internal combustion engine. The accuracy with which the fuel is metered necessarily increases with the accuracy of the data detection which, in turn, has a direct impact on the quality of the exhaust gas.

Figure 1A:
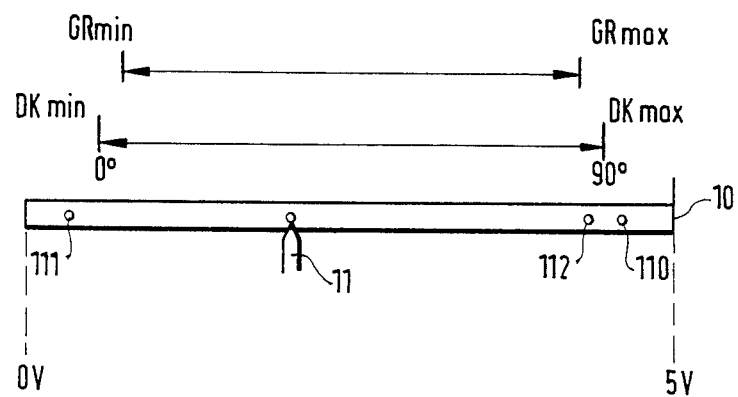
FIG. 1a is a schematic diagram of the arrangement of the invention for detecting measuring data wherein a potentiometer is utilized as the data detecting device.

FIG. 1a shows a slider track 10 on which a slider 11 is movable. The slider track is shown as being linear for reasons of simplicity. The measuring range of slider 11 is limited by DKmin and DKmax and corresponds in a special application to a throttle flap angular range of 90°. Here it is important to note that the entire measuring range of the slider lies within slider track 10. FIG. 1a further shows a measuring band bounded by limits of GRmin and GRmax. It extends an amount less than the measuring range of the slider which lies between DKmin and DKmax.

Figure 1B:
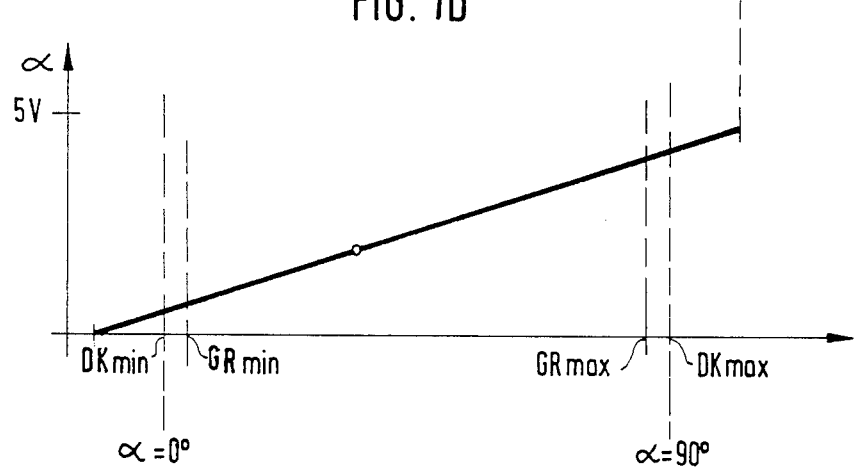
FIG. 1b is a graphical representation of the voltage ratios as a function of slider position; and, FIG. 2 is a flowchart illustrating a computer-controlled realization of the arrangement of the invention.

FIG. 1b illustrates the voltage ratios over the slider track assuming a linear course. The total operating voltage of the potentiometer drops along the entire slider track by an amount which may be 5 volts, for example. Subdividing the slider track into increments and assuming 8 bits, 0–255=256 increments will result for the entire length of the slider track. In accordance with FIGS. 1a and 1b, the measuring range of the slider covers only part of the slider track. For a specific position of the measuring range of the slider, the minimum and maximum slider voltages are at DKmin and DKmax, respectively. By analogy, the same applies to the limit values GRmin and GRmax for the measuring band. It is understood that the individual correspondence or ratios of magnitude of the individual data have to be adapted to the individual application and, in dependence upon the application, the differential values between DKmax and GRmax and DKmin and GRmin may also be very small.

As a rule, the measuring range of the slider between DKmin and DKmax is a given quantity determined by mechanical stops. Influences of any kind may, however, act upon this measuring range and cause it to be shifted to the left or to the right relative to the slider track 10, so that absolute correspondence of slider to electrical measured value is no longer correct.

Two kinds of shifts of the stops have to be distinguished, that is an outward shift thereof and an inward shift thereof.

If the stop is shifted outwardly, a measuring value DKmeas, for example, is detected which corresponds to the position of point 110 of FIG. 1a. In this event, DKmax is likewise displaced outwardly, followed by a corresponding displacement of DKmin, so that ultimately an electric displacement of the slider measuring range to the right occurs.

Similarly, if a measuring value corresponding to point 111 is detected which represents a leftward shift of the stop, DKmin and DKmax will be electrically shifted to the left.

Thus, the detection of an outward shift of the stops is relatively unproblematical and can be responded to in a suitable manner by defining new electric boundaries.

By contrast, an inward shift of the stops cannot be detected as readily. If, for example, a shift of the measuring range causes the right-hand stop of the slider to be at point 112, it is not readily obvious from the measured signal that the measuring range of the slider has shifted to the left.

The invention solves this problem by providing for a stepwise displacement of the boundary value DKmax to the left with a relatively large time constant provided that DKmax is still to the right of a defined boundary value GRmax. Between GRmin and GRmax the measured values are picked up and transmitted as measured; whereas, outside the measuring band between GRmin and GRmax, the boundary values GRmin or DKmax follow the values actually measured.

Thus, with the arrangement of the invention, electric stop signals are continuously made to follow measured values, provided that these measured values themselves lie in boundary regions, that is, above GRmax and below GRmin. In this arrangement, the follow-up speed is low relative to the dynamic change of the measured value.

In a specific application, it has proved suitable to select the factor 256/1 for the displacement speed of DKmax in the rightward direction relative to the leftward direction.

The arrangement of the invention is described further with reference to the flowchart of FIG. 2. The abbreviations of FIGS. 1a and 1b are utilized in FIG. 2.

The flowchart of FIG. 2 starts at 20. It is followed by an inquiry at 21 establishing whether measured value DKmeas is greater than a value DKmax held in a memory store. This corresponds to measuring point 110 of FIG. 1. If the answer is yes, DKmax is incrementally shifted to the right (block 22). At the same time, the measured value is set to the full value which for 8 bits corresponds to 255. A shift of the measuring band to the right occurs in block 23. There the new absolute limit value results from the new DKmax minus a tolerance value K. It is suitable to have the righthand boundary of the measuring band GRmax also move outwardly in increments. This is accomplished by inquiry unit 24 in combination with the incrementing in block 25. As the boundary value GRmax is shifted to the right, boundary value GRmin is likewise shifted to the right which corresponds to a shift of the entire measuring band to the right. The program ends at 26.

If measured value DKmeas is at point 112 of FIG. 1a, that is, it lies in the range between GRmax and DKmax, inquiry unit 30 will issue a corresponding signal, and both DKmax and DKmin will be incrementally shifted to the left in accordance with the data in block 31. The measuring signal then results according to block 32 from the quotient (DKmeas−DKmin)/(DKmax−DKmin). This program branch, too, ends finally at 26.

As will be seen from the flowchart, inquiry unit 30 is followed by the corresponding arrangement for the lower stops as it applies to the righthand stop side in inquiry units 21 and 30. Inquiry unit 40 determines whether measured value DKmeas is less than GRmin. If this is the case, DKmin will be incremented in block 41, and DKmax will be correspondingly shifted to the right. The output of block 41 is connected to block 32.

Another inquiry unit 50 determines whether measured value DKmeas is less than DKmin. In this instance, DKmin will be shifted to the left in block 51, a new limit value DKmin+K will be generated in block 52 as a tolerance value, and the positon of the measuring band between GRmin and GRmax will be adjusted in inquiry unit 53 and decrementing block 54. In this case, too, block 54 is followed by the end of the program sequence at 26.

If DKmeas is within the measuring band between GRmin and GRmax (line 55), inquiry unit 50 is then directly connected to block 32 computing the measured value.

It is noted that the measuring band between GRmin and GRmax may be chosen in dependence on operating characteristic quantities in order to be able to influence the follow-up sensitivity. Moreover, it is understood that the follow-up process may also occur on one side only.

While the embodiment referred to above relates to the use of the arrangement of the invention in connection with the sensing of the throttle flap position for an internal combustion engine, it is understood that the invention is also suitable for use according to the text of the introductory part of the description wherever a measurement is to take place within a displaceable measuring range.

It is further understood that the foregoing description is that of the preferred embodiment of the invention and that various changes and modifications may be made thereto without departing from the spirit and scope of the invention as defined in the appended claims.

What is claimed is:

1. An arrangement for detecting measuring data in motor vehicles especially in combination with apparatus for controlling the internal combustion engine, the arrangement comprising:

a potentiometer having a potentiometer track and a slider movable along said track detecting data between boundary values (DKmin and DKmax) of a measuring range disposed along a portion of said track, said boundary values together with said measuring range being shiftable in a first direction along said track or in a second direction therealong opposite to said first direction because of an external influence such as drift caused by component aging, inaccuracies introduced by repair work or the like;

means for electrically shifting at least one of said boundary values (DKmax, DKmin) is one of said directions so as to coincide with a measured value (DKmeas) thereof detected by said slider; and, means for causing the electrical shift of said boundary value to occur at first and second speeds in dependence upon in which of said two directions the boundary value (DKmax, DKmin) is shifted, said first speed being greater than said second speed.

2. The arrangement of claim 1, said measuring range between DKmin and DKmax being shifted with said one boundary value (DKmax, DKmin).

3. The arrangement of claim 1, wherein there is a measuring band having a predetermined length between limit values (GRmin and GRmax) along said track and entirely within said measuring range, said measuring band being selected so that it remains within said measuring range when the latter shifts along said track in response to said external influence; wherein a measuring position of said slider (DKmeas, 11) outside of said measuring band and yet within said measuring range can correspond to a new electrical value for one of said boundary values (DKmin, DKmax); and wherein said arrangement comprises means for electrically shifting said one boundary value in the direction corresponding to said first speed.

4. The arrangement of claim 3, said measuring band between GRmin and GRmax being dependent upon corrective quantities.

5. The arrangement of claim 1, wherein said slider moves dynamically through said measuring range in response to dynamic movements associated with the operation of the engine to provide dynamic changes in the measured value (DKmeas) detected by said slider, said first and second speeds being small in comparison to the speed of said dynamic changes.

6. The arrangement of claim 1 wherein an actuation of said slider inwardly from one of said boundary values (DKmin, DKmax) to a measuring position (DKmeas, 11) outside of said measuring band and yet within said measuring range constitutes an inwardly directed movement whereas an actuation of said slider to a location outside of said measuring range and beyond one of said boundary values constitutes an outwardly directed movement, said first speed corresponding to said inwardly directed movement and said second speed corresponding to said outwardly directed movement, said second speed having a ratio to said first speed of 256/1.

* * * * *

UNITED STATES PATENT AND TRADEMARK OFFICE
CERTIFICATE OF CORRECTION

PATENT NO. : 4,730,264

DATED : March 8, 1988

INVENTOR(S) : Rolf Kohler

It is certified that error appears in the above-identified patent and that said Letters Patent is hereby corrected as shown below:

On the title page under "References Cited (U.S. Patent Documents)", line 2, please delete "Fukkle" and substitute -- Pribble -- therefor.

In column 4, line 35, please delete "is" and substitute -- in -- therefor.

Signed and Sealed this

Sixteenth Day of August, 1988

Attest:

DONALD J. QUIGG

Attesting Officer

Commissioner of Patents and Trademarks